United States Patent [19]

Yamauchi et al.

[11] Patent Number: 5,409,843
[45] Date of Patent: Apr. 25, 1995

[54] METHOD OF PRODUCING A SEMICONDUCTOR DEVICE BY FORMING CONTACTS AFTER FLOWING A GLASS LAYER

[75] Inventors: Tunenori Yamauchi; Yoji Wakui, both of Kawasaki, Japan

[73] Assignee: Fujitsu, Ltd., Kawasaki, Japan

[21] Appl. No.: 933,584

[22] Filed: Aug. 24, 1992

Related U.S. Application Data

[63] Continuation of Ser. No. 625,690, Dec. 12, 1990, abandoned, which is a continuation of Ser. No. 512,491, Apr. 20, 1990, abandoned, which is a continuation of Ser. No. 245,926, Sep. 16, 1988, abandoned, which is a continuation of Ser. No. 128,021, Dec. 3, 1987, abandoned.

[30] Foreign Application Priority Data

Dec. 3, 1986 [JP] Japan .................. 61-288084

[51] Int. Cl.⁶ .................. H01L 21/265; H01L 29/70
[52] U.S. Cl. .................. 437/31; 437/59; 437/193
[58] Field of Search .................. 437/31, 34, 41, 46, 437/56, 57, 59, 193, 194, 982

[56] References Cited

U.S. PATENT DOCUMENTS

| | | | |
|---|---|---|---|
| 3,912,558 | 10/1975 | Luce | 437/982 |
| 3,915,767 | 10/1975 | Welliver | 437/982 X |
| 4,204,894 | 5/1980 | Komeda | 437/982 X |
| 4,224,089 | 9/1980 | Nishimoto et al. | 437/982 X |
| 4,404,733 | 9/1983 | Sasaki | 437/982 X |
| 4,433,468 | 2/1984 | Kawamata | 437/194 |
| 4,445,268 | 5/1984 | Hirao | 437/31 |
| 4,499,653 | 2/1985 | Kub et al. | 437/982 X |
| 4,707,456 | 11/1987 | Thomas et al. | 437/34 |
| 4,743,564 | 5/1988 | Sato et al. | 437/982 X |
| 4,795,722 | 1/1989 | Welch et al. | 437/982 |
| 4,797,372 | 1/1989 | Verret et al. | 437/34 |
| 4,927,776 | 5/1990 | Soejima | 437/59 |

FOREIGN PATENT DOCUMENTS 0071010 9/1983 European Pat. Off. .

OTHER PUBLICATIONS

Magdo, Ingrid; IEEE Journal of Solid–State Circuits, vol. 4, Aug. 1980, pp. 459–461, IEEE, New York, US; "Vertical p–n–p for Complementary Bipolar Technology".

Patent Abstracts of Japan, vol. 4, No. 121, 27th Aug. 1980, p. 27 E 23; & JP-A-55 75 219 (Tokyo Shibaura Denki K.K.) 06-06-1080.

Y. Okada et al: "ABC–An Advanced Bipolar–CMOS VLSI Technology", Extended Abstracts of 16th Conference on Solid State Devices and Materials, A-5-3, 1984, pp. 229–232, Kobe, Japan.

A. R. Alvarez et al: "2 Micron Merged Bipolar–CMOS Technology", IEDM, Tech. Dig., pp. 761–764, 1984 month unknown.

*Primary Examiner*—Robert Kunemund
*Assistant Examiner*—Long Pham
*Attorney, Agent, or Firm*—Staas & Halsey

[57] ABSTRACT

A method of producing a semiconductor device comprising a bipolar transistor and a MOSFET (e.g., a BiMOS device), comprising the steps of: forming an insulating layer on an epitaxial silicon layer on a semiconductor substrate; forming a gate electrode; forming a base region; forming a PSG (an impurity containing glass) layer on the whole surface; carrying out a heat-treatment on the PSG to cause a softening and flow thereof (sloping ends of and flattening the PSG layer); opening collector, emitter, source and drain contact windows in the PSG layer and the insulating layer; forming a doped polysilicon layer over the contact windows with the formation of an emitter region; opening a base contact window; and forming metal (Al) electrodes.

17 Claims, 3 Drawing Sheets

METHOD OF PRODUCING A SEMICONDUCTOR DEVICE BY FORMING CONTACTS AFTER FLOWING A GLASS LAYER

This application is a continuation of application Ser. No. 07/625,690, filed Dec. 12, 1990, now abandoned, which is a continuation of Application Ser. No. 07/512,491, filed Apr. 20, 1990, abandoned; which is a continuation of Application Ser. No. 245,926, filed Sep. 16, 1988, abandoned; and which is a continuation of Application Ser. No. 128,021, filed Dec. 3, 1987, abandoned.

BACKGROUND OF THE INVENTION

1. Field of the Invention

The present invention relates to a semiconductor device, and more particularly, to a method of producing a semiconductor device comprising at least a bipolar transistor. The present invention is preferably applied to the production of a semiconductor device comprising a bipolar transistor and a metal-oxide-semiconductor field effect transistor (MOSFET).

2. Description of the Related Art

A semiconductor device comprising a bipolar transistor and MOSFET has been produced on the same chip by a bipolar MOS (Bi-MOS) technology (see, e.g., Y. Okada et al: "ABC—An Advanced Bipolar-CMOS VLSI Technology," Extended Abstracts of 16th Conference on Solid State Devices and Materials, A-5-3, 1984, pp. 229-232, and A. R. Alvafez et al, "2MICRON MERGED BIPOLAR-CMOS TECHNOLOGY," IEDM, Tech Dig. pp. 761-764, 1984).

In general, interconnections including the electrodes of a bipolar transistor and the source and drain electrodes of a MOSFET are made of a metal layer of aluminum (Al) or alloy thereof, and these electrodes are formed with an insulating layer so that they are buried in electrode contact windows formed in the insulating layer. The insulating layer over a polycrystalline silicon gate which has these electrode contact windows, has a step-like portion, which can cause a break in the interconnections, resulting in a device failure or a formation of a thin portion thereof which reduces the reliability of the device. Also so-called stepcoverage defects of the metal layer (interconnections) occur. To eliminate the above disadvantages, the step-like portion of the insulating layer under the metal layer is gently sloped, i.e., the surface profile of the insulating layer is flattened, and this sloping or flattening contributes to a miniaturization of the pattern of the interconnections. Therefore, for flattening the insulating film, the insulating layer is made of an impurity-containing glass, such as phosphosilicate glass (PSG) and then the device is heated at a high temperature of, e.g., 1000° C., so that the glass layer is softened and made to flow, i.e., a so-called glass flow occurs.

When the glass flow technique is used for the insulating layer under the metal layer, a semiconductor device comprising, for example, an npn bipolar transistor and an n-channel MOSFET is produced in the following manner.

An n-type epitaxial silicon layer is formed on a p-type silicon substrate, and a p-type isolation region for the bipolar transistor and a p-well (p-type region) are simultaneously formed in the n-type epitaxial layer. An n-type contact layer is formed in the epitaxial layer portion surrounded by the isolation region, and the epitaxial silicon layer is selectively and thermally oxidized to form a thick oxide ($SiO_2$) insulating layer. The epitaxial silicon layer except for the already oxidized portion is then oxidized to form a thin oxide ($SiO_2$) insulating layer (a gate oxide layer). A polycrystalline silicon gate electrode is formed on the gate oxide layer, and donor impurities are ion-implanted into the p-well through the thin oxide insulating layer, in self-alignment with the gate electrode and the thick oxide insulating layer, to form an n-type source region and an n-type drain region. Acceptor impurities are ion-implanted into the isolated epitaxial silicon layer through the thin oxide insulating layer in self-alignment with the edge of the thick oxide insulating layer, so that a p-type base region is formed, and the thin oxide insulating layer is then selectively etched to open a collector contact window and an emitter contact window. A polycrystalline silicon layer is deposited and is patterned to cover the windows, respectively. The formation of the polycrystalline silicon layer prevents spiking of the aluminum alloying with silicon. Donor impurities are ion-implanted into the collector contact region and the base region through the polycrystalline silicon layer in the contact windows, respectively, to form an n-type contact region and an n-type emitter region, respectively. The PSG layer is then formed on the whole surface, including the gate electrode surface, and is flattened by a heat-treatment producing a glass flow. Note, since the PSG layer covering the gate electrode has undesirable step-like portions, the production process of the Bi-MOS technology includes an indispensable step of sloping and flattening the PSG layer. The PSG layer is selectively etched to open electrode contact windows (i.e., collector, emitter, base, source, drain, and gate electrode contact windows), and Al or Al alloy is then deposited on the whole surface and is patterned to form electrodes (i.e., collector, emitter, base, source, drain and gate electrode) and interconnections, and as a result, the desired semiconductor device is produced.

In the above process, a high temperature of, e.g., 1000° C., is used for the heat-treatment needed to cause the PSG flow (i.e., the flattening or smoothing of the PSG layer), but this high temperature causes an overdiffusion of donor impurities forming the emitter region. This causes an undesirable expansion of the emitter region with a corresponding variation in a current amplification factor: i.e., the current amplification factor of the bipolar transistors of the obtained semiconductor devices is uneven. Furthermore, a window opening step for the emitter of the bipolar transistor must be carried out twice, and if the alignment of the window position in the second window opening step in which the PSG layer is selectively etched is not correct, the portion of the thin oxide insulating layer adjoining the emitter region and outside the polycrystalline silicon layer on the emitter region may be etched during the PSG layer etching. In this case, when the metal layer for the emitter electrode is deposited, the metal layer causes a short circuit between the emitter and base. To prevent this defect, the dimensions of the polycrystalline silicon layer covering the emitter region must be made larger, While taking into consideration the alignment tolerance in the second window opening step. Accordingly, the distance between the emitter electrode and the base electrode must provide a sufficient margin. However, such an increase in the polycrystalline silicon layer area and the margin obstruct any intended miniaturization of the device.

SUMMARY OF THE INVENTION

An object of the present invention is to overcome the above-mentioned disadvantages by providing an improved production process for a semiconductor device comprising at least a bipolar transistor or a MOSFET.

Another object of the present invention is to simplify the production of the semiconductor device, and simultaneously, to contribute to a miniaturization of the device.

These and other objects of the present invention are attained by providing a method of producing a semiconductor device including a bipolar transistor and a MOSFET (Bi-MOS device), which method comprises the steps of: forming an insulating layer on an epitaxial layer on a semiconductor substrate; forming a gate electrode above the epitaxial layer in which the MOSFET is formed; forming a source and drain region in said epitaxial layer; forming a base region having a second conductivity type in the epitaxial silicon layer in which the bipolar transistor is formed; forming an impurity-containing glass layer on the insulating layer and the gate electrode; carrying out a heat-treatment to soften the glass layer and cause a flow thereof; opening at least an emitter contact window, a source contact window and a drain contact window in the glass layer and insulating layer; forming a doped polycrystalline silicon layer over the contact windows, so as to make an emitter region and a source and drain contact region having a second conductivity type opposite to said first conductivity type in said base region and the source and drain region, respectively; depositing a metal layer on said doped polycrystalline silicon layer; and patterning the metal layer to form electrodes of the bipolar transistor and MOSFET.

The doped polycrystalline silicon layer is formed by depositing an undoped polycrystalline silicon layer and then the layer is doped with impurities by an ion-implantation method to form a doped region (at least an emitter region, and additionally, a collector contact region) in the epitaxial silicon layer. Accordingly, the emitter region is formed after the heat-treatment for causing a flow of the glass layer, (i.e., the edge sloping and flattening of the impurity-containing glass layer under the metal layer), and thus an undesirable overexpansion of the emitter region does not occur.

According to the present invention, an emitter contact window opening step is performed only once for the emitter of the bipolar transistor, and it is unnecessary to increase the polycrystalline silicon layer over the emitter window and to ensure a sufficient margin between the emitter and base electrodes.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Before describing the preferred embodiments of the present invention, a prior art technique for the production of a semiconductor device comprising a bipolar transistor and a MOSFET is discussed.

Figure 1A:
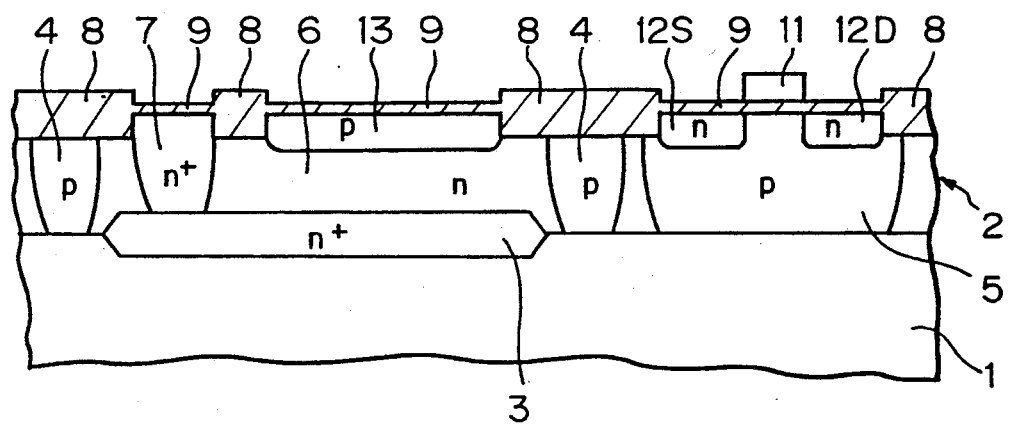
FIGS. 1A to 1C are schematic sectional views of a semiconductor device in various stages of production in accordance with a prior art technique.

As illustrated in FIG. 1A, impurities are selectively doped into a p-type silicon substrate (i.e., single crystalline silicon wafer) 1 to form an $n^+$-type region and then an n-type silicon layer 2 is epitaxially grown on the substrate 1, to form an $n^+$-type buried layer 3. Dopant atoms (acceptor impurities) are selectively doped into the silicon epitaxial layer 2 by thermal diffusion or ion-implantation, to form a p-type isolation region 4 for a bipolar transistor and a p-well (i.e., p-type region) 5 for a MOSFET reaching the p-type substrate 1. The portion 6 of the n-type epitaxial layer 2 surrounded by the isolation region 4 is a collector region. Other dopant atoms (donor impurities) are selectively doped into the silicon epitaxial layer 2 to form an n-type collector contact region 7 reaching the buried layer 3.

The silicon epitaxial layer 2 is selectively oxidized by the LOCOS process using a silicon nitride layer (not shown) to form a thick oxide ($SiO_2$) layer (insulating layer) 8 having a thickness of, e.g., approximately 800 nm. Then, after removal of the silicon nitride layer a thin insulating layer (i.e., a gate oxide layer) 9 made of $SiO_2$ and having a thickness of, e.g., approximately 70 nm, is formed by a thermal oxidation process. A doped polycrystalline silicon layer is deposited on the whole surface and is patterned (i.e., selectively etched) to form a gate electrode 11 for the MOSFET.

Donor impurities are doped through the gate oxide layer 9 by an ion-implantation method using a suitable masking layer (not shown) and the gate electrode 11 as a mask to form an n-type source region 12S and an n-type drain region 12D in the p-well 5. The dose of implanted phosphorus is, for example, $5 \times 10^{14}$ cm$^{-2}$. Then acceptor impurities are doped through the thin insulating layer 9 by an ion-implantation method using another suitable mask, to form a p-type base region 13 in the n-type collector region 6. The dose of implanted boron is, for example, $1 \times 10^{14}$ cm$^{-2}$. Then, a suitable annealing after ion-implantation is carried out. As a result of the above-mentioned production steps, the semiconductor device shown in FIG. 1A is obtained.

Figure 1B:
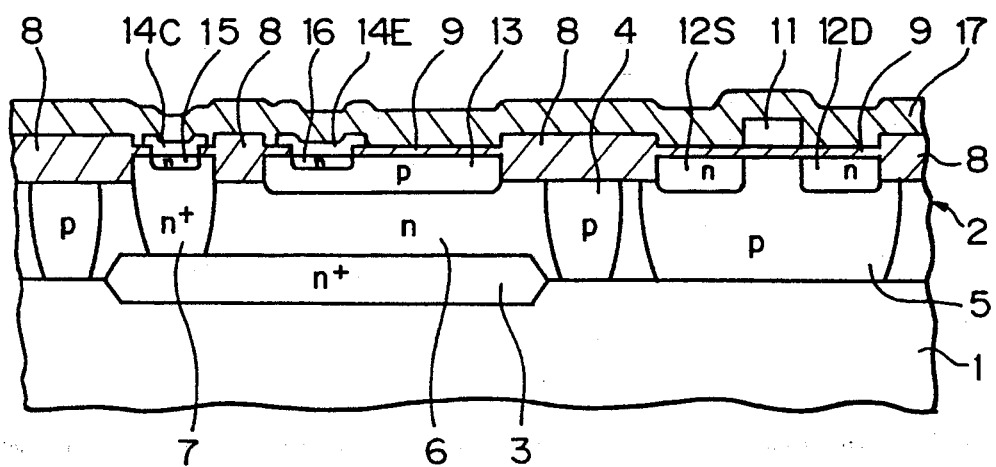

As illustrated in FIG. 1B, the thin insulating layer 9 on the collector contact region 7 and the base region 13 is selectively etched by a suitable etching method to form a collector contact window and an emitter contact window, and a polycrystalline silicon layer having a thickness of, e.g., 100 nm, is deposited on the whole surface and is patterned to form polycrystalline silicon layers 14C and 14E over the contact windows, respectively. Donor impurities are ion-implanted into the layers 14C and 14E, and further, into the collector contact region 7 and the base region 13, through the layers 14C and 14E, to form an n-type region 15 and an emitter region 16, respectively. A phosphosilicate glass (PSG) layer 17 having a thickness of, e.g., 800 nm, is deposited on the whole surface, including the gate surface, and is then subjected to a heat-treatment at a high temperature of, e.g., 1050° C., for a suitable time, e.g., 30 minutes, to slope edges and flatten the surface profile of the PSG layer 17. In particular, since the PSG layer over the gate electrode usually, has undesirable step-like portions, the PSG layer is heated to make it soften and flow, to change step-like portion into a gentle slope. This heat-treatment inevitably causes an expansion of the emitter region 16 by a further diffusion of the donor impurities in the base region 13.

Figure 1C:
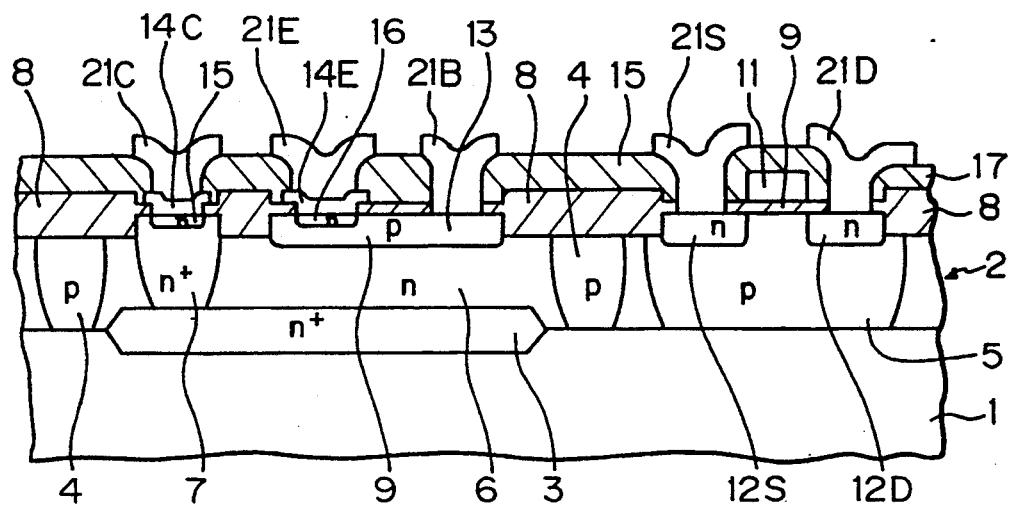

As illustrated in FIG. 1C, the PSG layer 17 is selectively etched by a suitable etching method to form contact windows for a collector electrode 21C, an emitter electrode 21E, a base electrode 21B, a source electrode 21S, a drain electrode 21D, and a gate electrode (not shown). After the formation of windows, aluminum (Al) is deposited on the whole surface by a vacuum evaporation method and is patterned (i.e., is selectively etched) to form the electrodes 21C, 21E, 21B, 21S, and 21D. Thus, the semiconductor device is obtained. The above method of producing the semiconductor device has the above-mentioned disadvantages.

Figure 2A:
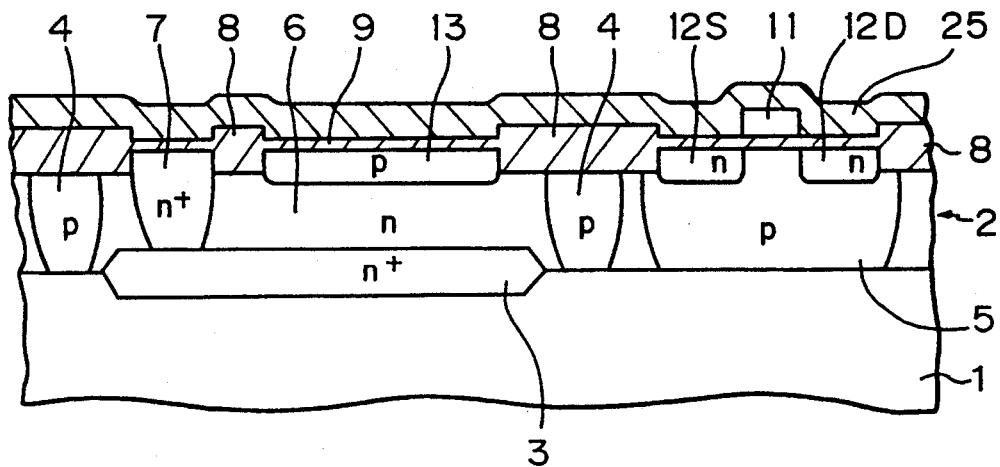
FIGS. 2A to 2C are schematic sectional views of a semiconductor device in various stages of production according to the method of the present invention.
Figure 2B:
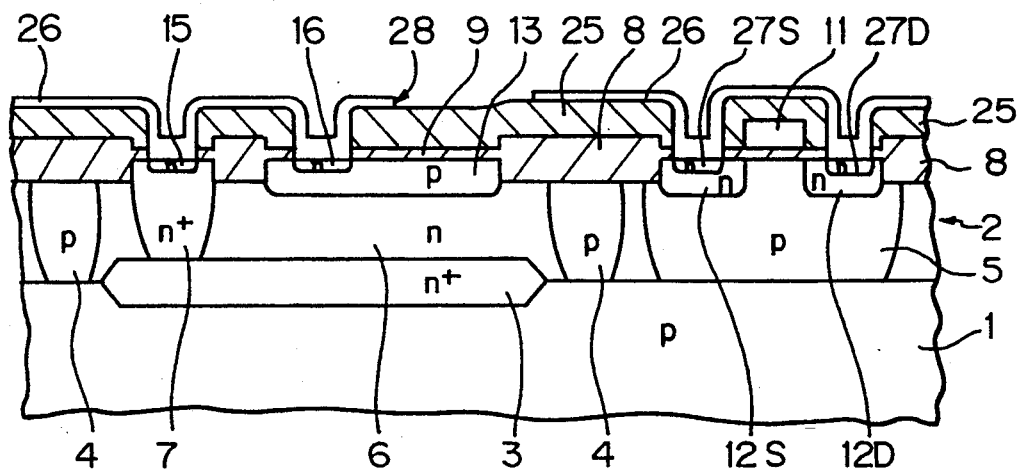
Figure 2C:
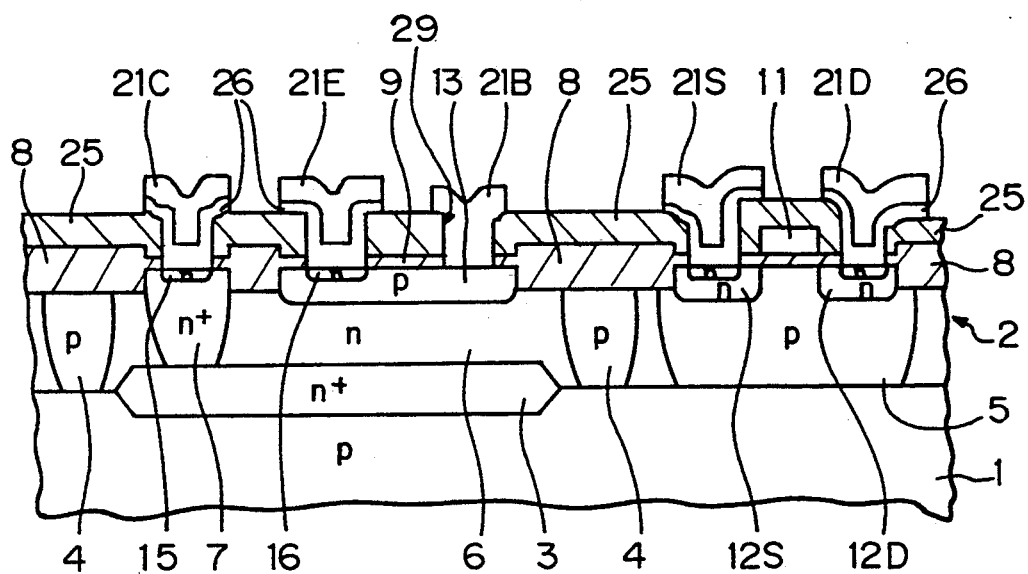

Referring to FIGS. 2A to 2C, a method of producing a semiconductor device (Bi-MOS device) comprising a bipolar transistor and a MOSFET in accordance with a preferred embodiment of the present invention is now explained.

After the semiconductor device shown in FIG. 1A is obtained, as illustrated in FIG. 2A, a PSG layer 25 having a thickness of, e.g., 800 nm, is deposited on the whole surface and then is subjected to the above mentioned heat-treatment, to slope edges and flatten the PSG layer 25.

As illustrated in FIG. 2B, the PSG layer 25 and the thin insulating layer 9 are selectively etched to open a collector contact window, an emitter contact window, a source contact window and a drain contact window, in which portions of the epitaxial silicon layer are exposed. A polycrystalline silicon layer 26 having a thickness of, e.g., 400 nm, is deposited on the whole surface. Donor impurities are ion-implanted into the layer 26, and further, into the collector contact region 7, the base region 13 and the p-well 5, to form an n-type region 15, an emitter region 16, an n-type source contact region 27S, and an n-type drain contact region 27D, respectively. The dose of implanted phosphorus is, for example, $5 \times 10^{15}$ cm$^{-2}$. The polycrystalline silicon layer 26 is selectively etched to open a window 28, in which a portion of the PSG layer 25 for a base contact window is exposed.

As illustrated in FIG. 2C, the PSG layer 25 and the thin insulating layer 9 are etched in the window 128 to open the base contact Window 29. At the Same time, another portion of the PSG layer 25 is etched to open a gate contact window (not shown). Then Al is deposited on the whole surface by a vacuum evaporation method to form an Al layer having a thickness of, e.g., 900 nm. The Al layer and the polycrystalline silicon layer 26 are patterned (i.e., are selectively etched in an etching step by using a suitable etchant) to form a collector electrode 21C, an emitter electrode 21E, a base electrode 21B, a source electrode 21S, a drain electrode 21D, and a gate electrode (not shown). Thus the Bi-MOS device is produced.

According to the present invention, the heat-treatment for sloping and flattening the PSG layer, on which the Al layer is formed, is performed prior to the formation of the emitter region, namely, after the anneal step of the emitter region, the emitter region is not subjected to the heat-treatment which is enough to substantially make the depth of the emitter region deeper. Therefore, the emitter region is not undesirably overexpanded, so that a current amplification factor of the bipolar transistor is accurately controlled and the produced bipolar transistors have an even current amplification factor. Since the opening step of the emitter contact window is performed only once, thereby simplifying production of the semiconductor device compared with that of the prior art, and contributing to a miniaturization of the device due to a decrease in the margin between the emitter and base electrode.

The MOSFET of the above-mentioned semiconductor device is an n-channel type and uses the p-well formed in the n-type epitaxial silicon layer. If initially the epitaxial layer is p-type, it is not necessary to form the p-well as explained above. Note, it is possible to produce a p-channel type MOSFET on the same chip so as to form complementary MOS (CMOS) FETs. The p-channel MOSFET can be produced by utilizing the production process of the semiconductor device. P-type source and drain regions of the p-channel MOSFET are formed in a portion of the n-type epitaxial silicon layer, by an ion-implantation of acceptor impurities at the same time as the formation of the p-type base region. When the polycrystalline silicon layer 26 is selectively etched to open the window 28 (FIG. 2B), simultaneously, the layer 26 is further etched to open two windows above the source region and the base region. Upon the opening of the base contact window, the PSG layer 25 and the thin insulating layer 9 are etched in through the windows to form a source contact window and a drain contact window, respectively. The contact windows are covered with the Al layer deposited on the whole surface and the Al layer is patterned to form a source electrode and a drain electrode of the p-channel MOSFET at the same time as the formation of the electrodes. If initially the epitaxial layer is p-type, it is necessary to form the n-well at the p-channel MOS transistor region in the p-type epitaxial layer.

It will be obvious that the present invention is not restricted to the above-mentioned embodiments and that many variations are possible for persons skilled in the art without departing from the scope of the invention.

We claim:

1. A method of producing a semiconductor device including a bipolar transistor, comprising the steps of:
   a) forming an insulating layer on an epitaxial layer of a semiconductor substrate having a first conductivity type;
   b) forming a base region having a second conductivity type opposite to the first conductivity type in the epitaxial layer;
   c) forming an impurity containing glass layer on the insulating layer;
   d) heat-treating the impurity containing glass layer, softening the impurity containing glass layer and causing it to flow;
   e) opening at least an emitter contact window in the impurity containing glass layer and the insulating layer;
   f) forming a doped polycrystalline silicon layer on the entire surface of the impurity containing glass layer and over the emitter window for creating an emitter region within the base region having the first conductivity type;
   g) performing said steps c)–f) in order;
   h) forming a base contact window in the impurity containing glass layer and the insulating layer;
   i) depositing a metal layer of Al or Al alloy on the doped polycrystalline silicon layer and in the base contact window; and j) patterning the metal layer and the polycrystalline silicon layer to form electrodes of the bipolar transistor having a double layer structure including the polycrystalline silicon layer and the metal layer.

2. A method according to claim 1, wherein said step a) of forming an insulating layer comprises thermally oxidizing the epitaxial silicon layer.

3. A method according to claim 1, wherein said step c) of forming an impurity containing glass layer comprises applying a layer of phosphosilicate glass.

4. A method according to claim 1, wherein said step e) of opening at least an emitter contact window comprises simultaneously opening a collector contact window.

5. A method according to claim 1, wherein said step f) of forming a doped polycrystalline silicon layer comprises the substeps of:
 i) depositing an undoped polycrystalline silicon layer; and
 ii) doping the polycrystalline silicon layer with impurities by ion-implantation forming a doped region in the epitaxial silicon layer.

6. A method according to claim 1, further comprising the step of forming a base contact window in the impurity containing glass layer and the insulating layer after said step f) of forming a doped polycrystalline silicon layer.

7. A method according to claim 6, further comprising the step of etching a portion of the doped polycrystalline silicon layer to expose the impurity containing glass layer for the base contact window, prior to said step of forming a base contact window.

8. A method according to claim 1, wherein the metal and the polycrystalline silicon layer are selectively etched.

9. A method of producing a semiconductor device including a bipolar transistor and a MOSFET, comprising the steps of:
 a) forming an insulating layer on an epitaxial layer of a semiconductor substrate;
 b) forming a gate electrode above the epitaxial layer in which the MOSFET is formed;
 c) forming a source region and a drain region in the epitaxial layer;
 d) forming a base region having a second conductivity type, in the epitaxial silicon layer in which the bipolar transistor is formed;
 e) forming an impurity containing glass layer on the insulating layer and the gate electrode;
 f) heat-treating the impurity containing glass layer, softening the impurity containing glass layer and causing it to flow;
 g) opening at least an emitter contact window, a source contact window and a drain contact window in the impurity containing glass layer and the insulating layer;
 h) forming a doped polycrystalline silicon layer on the entire surface of the impurity containing glass layer and over at least the emitter, source and drain contact windows, creating an emitter contact region, a source contact region and a drain contact region having a first conductivity type opposite to the second conductivity type of the base region;
 i) said steps e)–h) being performed in order;
 j) forming a base contact window in the impurity containing glass layer and the insulating layer;
 k) depositing a metal layer of Al or Al alloy on the doped polycrystalline silicon layer and in the base contact window; and
 l) patterning the metal layer and the polycrystalline silicon layer to form electrodes of the bipolar transistor and MOSFET, the electrodes having a double layer structure including the polycrystalline silicon layer and the metal layer.

10. A method according to claim 9, wherein said step a) of forming an insulating layer comprises thermally oxidizing the epitaxial silicon layer.

11. A method according to claim 9, wherein said step e) of forming an impurity containing glass layer comprises applying a layer of phosphosilicate glass.

12. A method according to claim 9, wherein said step g) of opening an emitter contact window, a source contact window and a drain contact window comprises the substep of simultaneously opening a collector contact window in the impurity containing glass layer and the insulating layer.

13. A method according to claim 9, wherein said step h) of forming a doped polycrystalline silicon layer comprises the substeps of:
 i) depositing an undoped polycrystalline silicon layer; and
 ii) doping the undoped polycrystalline silicon layer with impurities by ion-implantation forming a doped region in the epitaxial silicon layer.

14. A method according to claim 9, further comprising a step of opening a base contact window in the impurity containing glass layer and the insulating layer after said step h) of forming a doped polycrystalline silicon layer.

15. A method according to claim 14, further comprising the step of etching a portion of the doped polycrystalline silicon layer to expose the impurity containing glass layer for the base contact region, prior to said step of opening a base contact window.

16. A method according to claim 9, wherein said step j) of patterning the metal layer comprises selectively etching the doped polycrystalline silicon layer.

17. A method according to claim 9, wherein said semiconductor device further includes a complementary MOSFET having a second source region and a second drain region formed in the epitaxial silicon layer during said step of forming a base region.

* * * * *

UNITED STATES PATENT AND TRADEMARK OFFICE
CERTIFICATE OF CORRECTION

PATENT NO. : 5,409,843
DATED : April 25, 1995
INVENTOR(S) : Yamaguchi et al.

It is certified that error appears in the above-indentified patent and that said Letters Patent is hereby corrected as shown below:

Title page, ABSTRACT, change "ends" to --edges--;

Col. 1, line 31, change "Alvafez" to --Alvarez--;

Col. 2, line 64, change "While" to --while--;

Col. 5, line 1, after "change" insert --the--;

line 46, change "128" to --28--;

line 47, change "Window" to --window--;
change "Same" to --same--;

Col. 6, line 26, delete "in";

Col. 8, line 46, change "to expose" to --exposing--.

Signed and Sealed this

Twenty-second Day of August, 1995

Attest:

BRUCE LEHMAN

*Attesting Officer*     *Commissioner of Patents and Trademarks*